United States Patent
Ravi et al.

(10) Patent No.: US 9,705,613 B2
(45) Date of Patent: *Jul. 11, 2017

(54) FEEDBACK CALIBRATION OF DIGITAL TO TIME CONVERTER

(71) Applicant: Intel IP Corporation, Santa Clara, CA (US)

(72) Inventors: Ashoke Ravi, Hillsboro, OR (US); Ofir Degani, Haifa (IL); Hasnain Lakdawala, Portland, OR (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/099,301

(22) Filed: Apr. 14, 2016

(65) Prior Publication Data

US 2016/0337055 A1     Nov. 17, 2016

Related U.S. Application Data

(63) Continuation of application No. 14/140,801, filed on Dec. 26, 2013, now Pat. No. 9,331,722.

(51) Int. Cl.
*H04K 1/02*     (2006.01)
*H04L 25/03*     (2006.01)
(Continued)

(52) U.S. Cl.
CPC .......... *H04B 17/21* (2015.01); *H03M 1/1009* (2013.01); *H03M 1/84* (2013.01);
(Continued)

(58) Field of Classification Search
CPC ................. H04B 17/21; H04B 1/0475; H04B 2001/0425
See application file for complete search history.

(56) References Cited

U.S. PATENT DOCUMENTS 6,353,649 B1 * 3/2002 Bockleman ............. G06F 1/025
                                                          327/107
8,908,804 B2 * 12/2014 Kuttner .................... H03C 3/12
                                                          375/295
(Continued)

FOREIGN PATENT DOCUMENTS

CN        101160722 A     4/2008
CN        102111149 A     6/2011
(Continued)

OTHER PUBLICATIONS

"U.S. Appl. No. 14/140,801, Non Final Office Action mailed Jun. 25, 2015", 8 pgs.
(Continued)

*Primary Examiner* — Erin File
(74) *Attorney, Agent, or Firm* — Schwegman Lundberg & Woessner, P.A.

(57) ABSTRACT

This document discusses apparatus and methods for compensating non-linearity of digital-to-time converters (DTCs). In an example, a wireless device can include a digital-to-time converter (DTC) configured to receive a phase data information from a baseband processor and to provide a first modulation signal for generating a wireless signal, a detector configure to receive the first modulation signal and provide an indication of nonlinearities of the DTC, and a pre-distortion module configured to provide pre-distortion information to the DTC using the indication of nonlinearities.

22 Claims, 3 Drawing Sheets

(51) Int. Cl.
*H04L 25/49* (2006.01)
*H04B 17/21* (2015.01)
*H03M 1/84* (2006.01)
*H04B 1/04* (2006.01)
*H03M 1/10* (2006.01)
*H03M 1/82* (2006.01)

(52) U.S. Cl.
CPC ............ *H04B 1/0475* (2013.01); *H03M 1/82* (2013.01); *H04B 2001/0425* (2013.01)

(56) References Cited

U.S. PATENT DOCUMENTS

| | | | |
|---|---|---|---|
| 9,331,722 B2 | 5/2016 | Ravi et al. | |
| 2005/0186920 A1* | 8/2005 | Staszewski | H03L 7/16 455/114.1 |
| 2011/0156783 A1* | 6/2011 | Pavlovic | H03L 7/081 327/159 |
| 2012/0288044 A1* | 11/2012 | Roberts | H03L 7/00 375/350 |
| 2013/0223564 A1* | 8/2013 | Mayer | H04L 25/03343 375/296 |
| 2014/0002287 A1* | 1/2014 | Klepser | H04L 27/2003 341/144 |
| 2014/0211870 A1* | 7/2014 | Dufrene | H03C 5/00 375/259 |
| 2014/0321577 A1* | 10/2014 | Kuttner | H03C 3/12 375/302 |
| 2015/0036767 A1* | 2/2015 | Degani | H04L 27/36 375/298 |
| 2015/0091384 A1* | 4/2015 | Madoglio | H02J 17/00 307/104 |
| 2015/0139358 A1* | 5/2015 | Asuri | H04L 27/361 375/297 |
| 2015/0171848 A1* | 6/2015 | Bruennert | H03K 5/14 327/276 |
| 2015/0188583 A1 | 7/2015 | Ravi et al. | |

FOREIGN PATENT DOCUMENTS

| | | |
|---|---|---|
| CN | 103297366 A | 9/2013 |
| CN | 104753556 A | 7/2015 |
| DE | 102014017440 A1 | 7/2015 |

OTHER PUBLICATIONS

"U.S. Appl. No. 14/140,801, Non Final Office Action mailed Dec. 10, 2014", 7 pgs.

"U.S. Appl. No. 14/140,801, Notice of Allowance mailed Dec. 30, 2015", 5 pgs.

"U.S. Appl. No. 14/140,801, PTO Response to Rule 312 Communication mailed Apr. 8, 2016", 2 pgs.

"U.S. Appl. No. 14/140,801, Response filed Mar. 10, 2015 to Non Final Office Action mailed Dec. 10, 2014", 8 pgs.

"U.S. Appl. No. 14/140,801, Response filed Sep. 25, 2015 to Non Final Office Action mailed Jun. 25, 2015", 9 pgs.

"Chinese Application Serial No. 201410856391.7, Office Action mailed Aug. 18, 2016", 8 pgs.

\* cited by examiner

FEEDBACK CALIBRATION OF DIGITAL TO TIME CONVERTER

RELATED APPLICATION

This application is a continuation of U.S. patent application Ser. No. 14/140,801, filed on Dec. 26, 2013, now issued as U.S. Pat. No. 9,331,722, which is incorporated herein by reference in its entirety.

BACKGROUND

Digital polar transmitter architectures are becoming attractive for modern radios such as the radios used in cell phones and other mobile communication devices. This attractiveness can be associated with improved area use and improved power efficiency that digital polar transmitters appear to offer. Handling wideband radio frequency signals associated with modern communication protocols, such as WiFi 802.11ac (@0 Mhz to 160 MHz bandwidth) and LIE (10-40 MHz bandwidth) can be a challenge to digital polar transmitter architectures. For some polar architectures, this can be especially tough when the bandwidth of the phase component of the radio frequency signal can be up to 10 times wider than the radio frequency signal itself. Phased-locked loop-based solutions are typically used to generate the phase modulation signals for narrow-band standards (e.g., up to 4 Mhz) such as GSM/EDGE, Bluetooth and WCDMA. However, PLLs do not typically deliver the required modulation quality (EVM) and spectral emission (mask) for wider bandwidth standards such as WiFi and LTE.

OVERVIEW

This document discusses apparatus and methods for compensating non-linearity of digital-to-time converters (DTCs). In an example, a wireless device can include a digital-to-time converter (DTC) configured to receive a phase data information from a baseband processor and to provide a first modulation signal for generating a wireless signal, a detector configure to receive the first modulation signal and provide an indication of nonlinearities of the DTC, and a pre-distortion module configured to provide pre-distortion information to the DTC using the indication of nonlinearities.

This overview is intended to provide a general overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Emerging communication technologies include topographies that can include DTC-based transmitters, including but not limited to, polar transmitters. In certain examples, DTC-based transmitters can provide superior performance and capabilities that can be more immune to certain interferences and can provide the capability to handle wider bandwidth signals (e.g., >11.0 MHz) than can be processed by conventional PLL based implementations. In addition, support for frequency duplexing (e.g., LTE) and multi-standard coexistence in small form factor communication devices present additional challenge's to conventional PLL-based implementations.

In certain examples, far out noise floor requirements in order not to de-sense a receiver can pose a strict requirement on quantization noise level, such as the quantization noise level of a DTC used in a DTC-based transmitter. For example, for a 2.5 GHz local oscillator, the number of bits of resolution can be 14 or higher which can translate into a 25 femtosecond resolution for the DTC. In addition to quantization noise constraints, non-linearity in the code-delay transfer function of the DTC due to systemic and random variations in the delay elements can provide additional implementation challenges associated with DTC based transmitters. Integral non-linearity (INL) can degrade the modulation quality (EVM) and mask far-out spectrum of the DTC. System simulations indicate that the INL of the DTC needs to be corrected to the level of quantization noise in order to minimize the impact of the degradation. In certain example, the INL of the DTC can be influenced by long term drifts in addition to static variations such as process corners.

Figure 1:
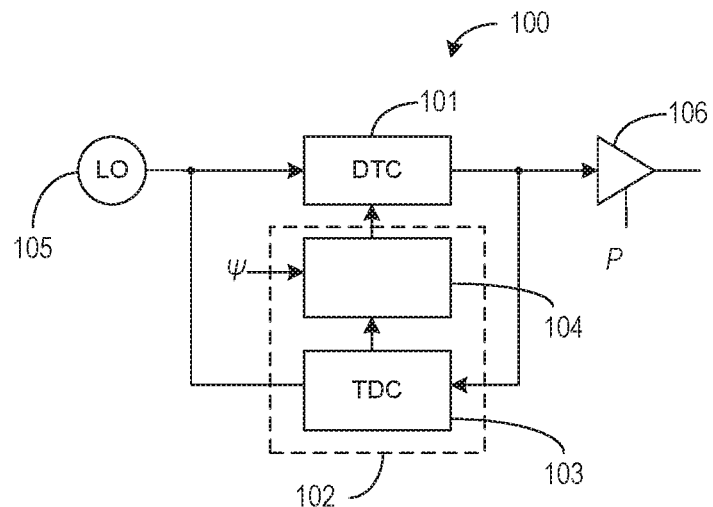
FIG. 1 illustrates generally example calibration architecture for a DTC-based digital transmitter.

The present inventors have recognized apparatus and methods for measuring, correcting, and tracking DTC non-linearity without interrupting normal operation of the DTC. In certain examples, DTC non-linearity can be measured and corrected during a power-on sequence. In some examples, DTC non-linearity can be tracked and modulated as the DTC operates. FIG. 1 illustrates generally example calibration architecture 100 for a DTC-based digital polar transmitter. In certain examples, the calibration architecture 100 can include a DTC 101 and a calibration and correction module 102 including a time-to-digital converter (TDC) 103 and a pre-distortion module 104. The DTC 101 can receive reference frequency information from a local oscillator (LO) 105 and can provide phase information to a digital power amplifier 106. In certain examples, the digital power amplifier 106 can mix the phase information from the DTC 101 with amplitude information ($\rho$) to provide a radio frequency signal for broadcast using an antenna. In certain examples, the DTC 101 can apply desired phase modulation ($\psi$) to the reference frequency information by adjusting the location of each edge of the reference frequency information. The TDC 103 can be used in comparing differences between the desired phase modulation and the difference between the output and input of the DTC 101 (e.g., actual phase modulation) to measure DTC non-linearity. In some examples, measurement of DTC non-linearity can be accomplished by comparing each applied phase modulation word against the corresponding measurement of the TDC 103. In certain examples, the measured DTC non-linearity can then be used to provide a map or recipe for the pre-distortion module 104 that can be applied to the phase modulation information ($\psi$) to correct the non-linearity of the DTC 101.

Figure 2:
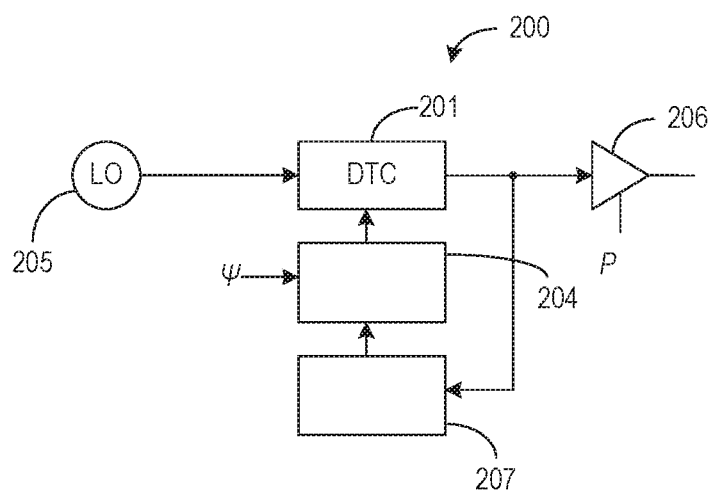
FIG. 2 illustrates generally example calibration architecture for a DTC-based digital transmitter.

FIG. 2 illustrates generally example calibration architecture 200 for a DTC-based digital transmitter. The architecture can include a DTC 201, a statistical extraction module 207 and a pre-distortion module 204. In certain examples, the statistical extraction module 207 can construct a histogram of measured phase differences. In certain examples, the statistics of the desired phase modulation information ($\psi$) are known or can be computed. DTC non-linearity and code-phase transfer function can be estimated from the ratio of the probability distribution histograms of the input phase signal and the collected histogram. The cumulative distribution function (CDF) can be obtained from the statistical extraction module 207 and can be used to generate or provide a pre-distortion mapping table for correcting the non-linearity using the pre-distortion module 204.

Figure 3:
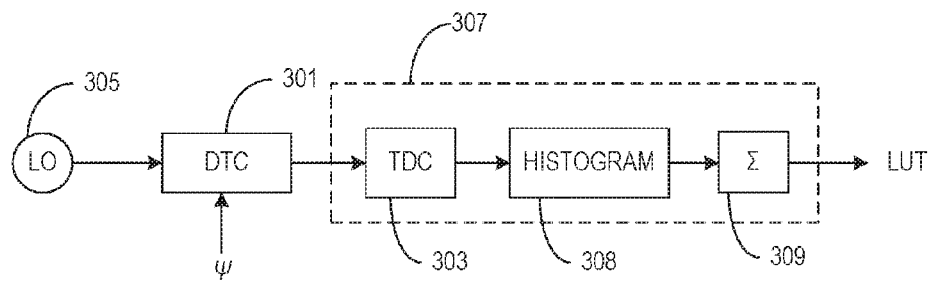
FIG. 3 illustrates generally example calibration architecture including details of a statistical extraction module for providing an initial calibration.

FIG. 3 illustrates generally example calibration architecture 300 including details of a statistical extraction module 307 for providing an initial calibration. In certain examples, the architecture 300 can include a DTC 301 for receiving local oscillator (LO) information and phase modulation information ($\psi$) and for providing a phase modulation signal. In certain examples, the architecture 300 can include a statistical extraction module 307 for providing a look-up table (LUT) to compensate for non-linearity of the DTC 301. In some examples, the statistical extraction module 307 can be used in an initial calibration mode. In such examples, the statistical extraction module 307 can be enabled during an initialization interval of the device including the DTC 301 and can provide the look-up table (LUT) for use by pre-distortion circuitry thereafter. In theory, and in certain examples, the DTC 301 can provide accurate and reliable phase modulation using only an initial calibration look-up table (LUT). In certain examples, the statistical extraction module 307 can include a TDC 303 for generating a histogram 308 of DTC conversions and averaging or summing circuitry 309 for mapping differences between predetermined phase modulation information ($\psi$) and actual phase modulation of the DTC 301. In certain examples, and although a single calibration look-up table (LUT) can be used to provide accurate and reliable phase modulation, the statistical extraction module 307 can also be used as shown in FIG. 2 to provide ongoing adjustments to the look-up table (LUT), for example, to compensate for aging conditions of the DTC 301 including, but not limited to, changes in temperature, pressure, etc. In certain examples, the statistical extraction module 307 can be enable to run in the background of a device that includes the DTC 301, such as a polar transmitter device, for example.

Figure 4:
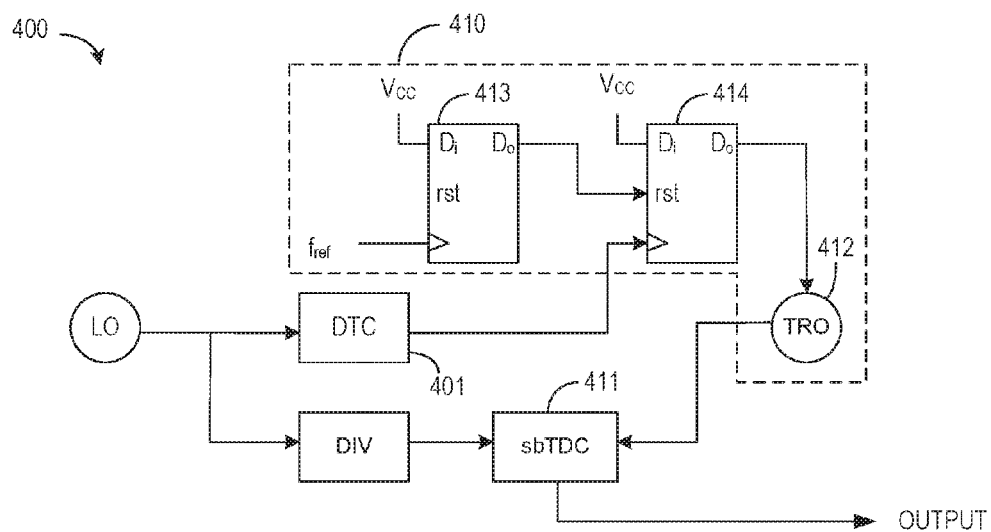
FIG. 4 illustrates an example calibration architecture including a time domain sample and hold and a stochastic beating TDC (sbTDC).

FIG. 4 illustrates an example calibration architecture 400 including a time domain sample and hold 410 and a stochastic beating TDC (sbTDC) 411. The architecture 400 recognizes that in order to provide accurate phase modulation (e.g., on the order of 100 femtoseconds (fs)), in certain examples, a shTDC-based calibration architecture 400 can reuse delay elements and can exploit spatial mismatch to support a desired delay range with good linearity and resolution, such as on the order of 1 picosecond or better. In certain examples, dynamic range of a TDC can be segmented into a linear by construction beating TDC, for coarse resolution; and a stochastic TDC for fine resolution. In traditional PLL applications, a trigger ring oscillator (TRO) can be triggered on each rising edge of a reference signal. The TRO output can be used to sample the state of the LO signal to extract the phase of the LO relative to the reference signal. In certain examples of the present subject matter, the rising edge of the reference signal ($f_{ref}$) can open a sampling window and the first subsequent DTC 401 output can trigger a TRO 412. The combination of the two flip-flops 413, 414 and the TRO 412 can operate as a sample-and-hold 410 for delay. The output of the TRO 412 can be used to sample the LO signal or a divided (DIV) representation of the LO signal. The remainder of the operation of the sbTDC 411 in the calibration scheme can be similar to that of the PLL to thereafter estimate the phase difference between the DTC input and output. In certain examples, the sbDTC 411 does not make an instantaneous measurement, but instead makes the same measurement over multiple periods. The sample and hold circuit 410 can create a window to capture a particular edge of the DTC output. The captured edge can trigger the TRO 412 such that each output of the TRO 412 presents a copy of the particular edge of the DTC 401. The sbTDC 411 can then measure the difference between the input of the DTC 401 and the DTC output and provide the calibration information (OUTPUT) for stabilizing the DTC 401.

It is understood that other TDC architecture are possible for calibrating a DTC in the proposed calibration schemes without departing from the scope of the present subject matter. Such TDC architectures can include, but are not limited to, Vernier delay line, interpolating delay line, stochastic flash, etc. The quantization noise and linearity of the TDC can limit the accuracy of the integral non-linearity measurements. The effective resolution of coarser TDCs can be improved by time averaging, in certain examples, circuit noise (jitter) of the DTC and the TDC can help break tonal behavior of TDC measurements and can improve resolution through averaging. In certain examples, TDC non-linearity can be calibrated and corrected in the background using a similar statistical extraction scheme.

Figure 5:
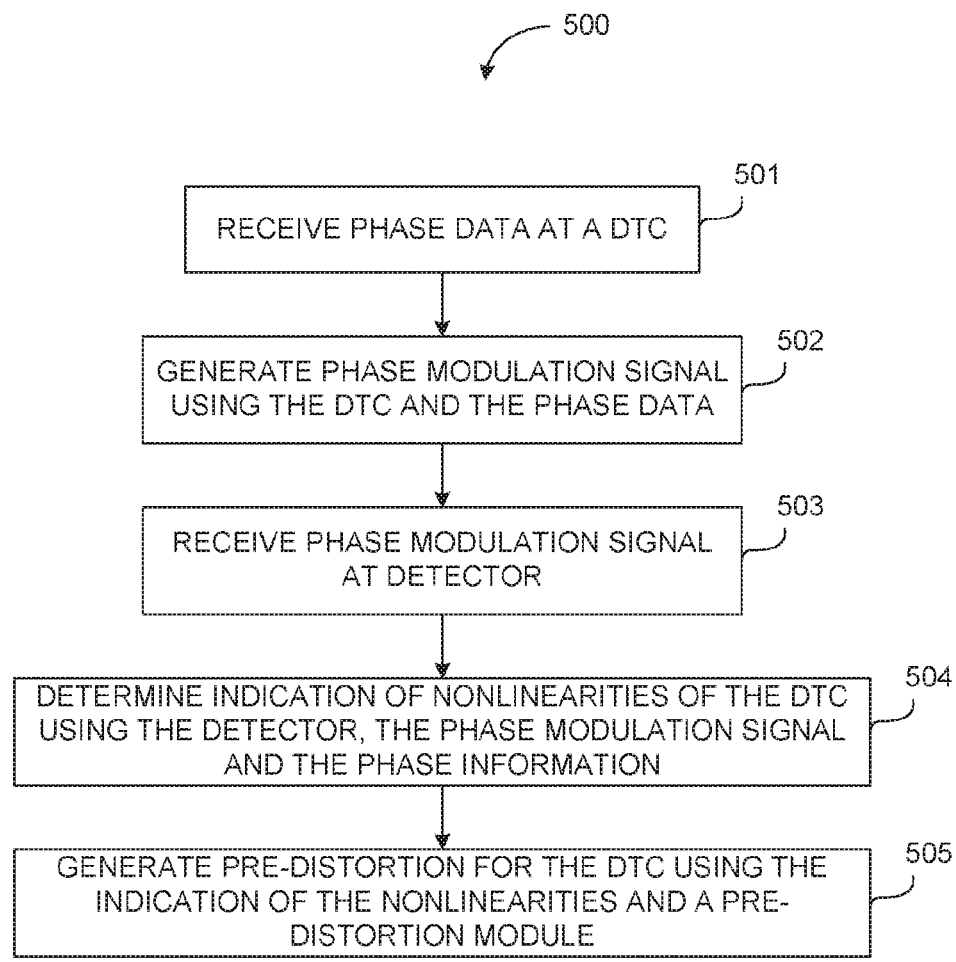
FIG. 5 illustrates generally an example method of generating compensation information to correct nonlinearities of a DTC.

FIG. 5 illustrates generally an example method 500 of generating compensation information to correct nonlinearities of a phase modulating DTC. At 501, the method can include receiving phase data such as phase modulation information at the DTC. At 502, the DTC can generate a phase modulation signal using the phase data and a reference periodic signal. At 503, a detector can receive the phase modulation signal. At 504, an indication of the nonlinearities of the DTC can be determined at the detector using the phase modulation signal and the phase data. In certain examples, the detector can generate a pre-distortion mapping table. The pre-distortion mapping table can include information for compensating the nonlinearities of the DTC. In certain examples, the pre-distortion mapping table can be generated using comparisons of the statistical measurement of the modulation signal to the known statistical measurement of the phase data. At 505, a pre-distortion module can generate pre-distortion information for the DTC using the indication of nonlinearities of the DTC.

ADDITIONAL NOTES

In Example 1, a wireless device can include a digital-to-time converter (DTC) configured to receive a phase data information and to generate a first modulation signal for a wireless signal, a detector configure to receive the first modulation signal and to determine an indication of nonlinearities of the DTC, and a pre-distortion module configured to generate pre-distortion information for the DTC using the indication of nonlinearities.

In Example 2, the detector of Example 1 optionally includes a time-to-digital converter (TDC) configured to receive the phase data information, to measure phase differences between each phase modulation word of the phase data information and the first modulation signal, and to determine the indication of nonlinearities using the phase differences.

In Example 3, the TDC of any one or more of Examples 1-2 optionally includes a stochastic-beating TDC.

In Example 4, the stochastic-beating TDC of any one or more of Examples 1-3 optionally includes a beating TDC configured to generate course resolution, and a stochastic TDC configured to generate fine resolution.

In Example 5, the stochastic-beating TDC of any one or more of Examples 1-4 optionally includes a flip-flop network, and a triggered ringing oscillator (TRO), wherein an output of the TRO is configured to sample the phase data information and the flip-flop network is configured to sample and hold an edge of an output of the DTC.

In Example 6, the detector of any one or more of Examples 1-5 optionally includes a statistical extractor, the statistical extractor configured to statistically measure the first modulation signal and to compare the statistical measurement of the first modulation signal to a known statistical measurement of the phase data information.

In Example 7, the pre-distortion module of any one or more of Examples 1-6 optionally includes a noise shaper, and wherein the detector of any one or more of Examples 1-6 optionally is configured to adjust parameters of the noise shaper to compensate for nonlinearities of the DTC using the comparison of the statistical measurement of the first modulation signal to the known statistical measurement of the phase data information.

In Example 8, the detector of any one or more of Examples 1-2 optionally is configured to generate a pre-distortion mapping table, and wherein the pre-distortion module of any one or more of Examples 1-7 optionally is configure to compensate for nonlinearities of the DTC using the pre-distortion mapping table.

In Example 9, the statistical extractor of any one or more of Examples 1-8 optionally includes a time-to-digital converter (TDC) configure to provide a histogram of the first modulation signal.

In Example 10, the statistical extractor of any one or more of Examples 1-9 optionally is configured to interpolate the histogram if the resolution of the DTC differs from the resolution of the TDC.

In Example 11, the TDC of any one or more of Examples 1-10 optionally includes a stochastic-beating TDC.

In Example 12, a method of compensating nonlinearities of a transmitter can include receiving a phase data information at a DTC of the transmitter, generating a phase modulation signal using the DTC and the phase data information, receiving the phase modulation signal at a detector, determining an indication of nonlinearities of the DTC using the detector, the phase modulation signal and the phase data, and generating pre-distortion information for the DTC using the indication of nonlinearities and a pre-distortion module.

In Example 13, the receiving the phase modulation signal at a detector of any one or more of Examples 1-12 optionally includes receiving the phase modulation information at a time-to-digital converter (TDC), wherein the method of any one or more of Examples 1-12 optionally includes measuring phase differences between each phase modulation word of the phase data information and the first modulation signal, and wherein the determining the indication of nonlinearities of any one or more of Examples 1-12 optionally includes determining the indication of nonlinearities using the phase differences.

In Example 14, the receiving the phase modulation signal of any one or more of Examples 1-13 optionally includes receiving the phase modulation information at a stochastic-beating TDC.

In Example 15, the receiving the phase modulation signal at a detector of any one or more of Examples 1-14 optionally includes receiving the phase modulation information at a statistical extractor, wherein the method of any one or more of Examples 1-14 optionally includes statistically measuring the first modulation signal using the statistical extractor, and comparing the statistical measurement of the first modulation signal to a known statistical measurement of the phase data signal.

In Example 16, the method of any one or more of Examples 1-15 optionally includes adjusting parameters of a noise shaper of the DTC to compensate for nonlinearities of the DTC using the comparison of the statistical measurement of the first modulation signal to the known statistical measurement of the phase data signal.

In Example 17, the determining an indication of nonlinearities of the DTC of any one or more of Examples 1-16 optionally includes generating a pre-distortion mapping table comprising information to compensate for nonlinearities of the DTC using the comparison of the statistical measurement of the first modulation signal to the known statistical measurement of the phase data signal.

In Example 18, the statistically measuring the first modulation signal of any one or more of Examples 1-17 optionally includes generating a histogram of the first modulation signal using a time-to-digital converter (TDC).

In Example 19, the statistically measuring the first modulation signal of any one or more of Examples 1-18 optionally includes generating a histogram of the first modulation signal using a stochastic-beating TDC.

In Example 20, the method of any one or more of Examples 1-2 optionally includes interpolating the histogram if the resolution of the DTC differs from the resolution of the TDC.

Example 21 can include, or can optionally be combined with any portion or combination of any portions of any one or more of Examples 1 through 20 to include, subject matter that can include means for performing any one or more of the functions of Examples 1 through 20, or a machine-readable medium including instructions that, when performed by a machine, cause the machine to perform any one or more of the functions of Examples 1 through 20.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein," Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc, are used merely as labels, and are not intended to impose numerical requirements on their objects.

The above description is intended to be illustrative, and not restrictive. For example, the above-described examples or one or more aspects thereof may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
   a digital-to-time converter (DTC) configured to receive phase data information and to generate a signal;
   a detector configure to receive the signal and to determine an indication of nonlinearities of the DTC; and
   a pre-distortion module configured to generate pre-distortion information for the DTC using the indication of nonlinearities.

2. The apparatus of claim 1, wherein the detector includes a time-to-digital converter (TDC) configured to receive the phase data information, to measure phase differences between each phase modulation word of the phase data information and the signal, and to determine the indication of nonlinearities using the phase differences.

3. The apparatus of claim 2, wherein the TDC includes a stochastic-beating TDC.

4. The apparatus of claim 3, wherein the stochastic-beating TDC includes:
   a beating TDC configured to generate course resolution; and
   a stochastic TDC configured to generate fine resolution.

5. The apparatus of claim 4, wherein the stochastic-beating TDC includes:
   a flip-flop network; and
   a triggered ringing oscillator (TRO); wherein an output of the TRO is configured to sample the phase data information and the flip-flop network is configured to sample and hold an edge of an output of the DTC.

6. The apparatus of claim 1, wherein the detector includes a statistical extractor, the statistical extractor configured to statistically measure the signal and to compare the statistical measurement of the signal to a known statistical measurement of the phase data information.

7. The apparatus of claim 6, wherein the pre-distortion module includes a noise shaper; and
wherein the detector is configured to adjust parameters of the noise shaper to compensate for nonlinearities of the DTC using the comparison of the statistical measurement of the signal to the known statistical measurement of the phase data information.

8. The apparatus of claim 6, wherein the detector is configured to generate a pre-distortion mapping table; and
   wherein the a pre-distortion module is configure to compensate for nonlinearities of the DTC using the pre-distortion mapping table.

9. The apparatus of claim 6, wherein the statistical extractor includes a time-to-digital converter (TDC) configure to provide a histogram of the signal.

10. The apparatus of claim 9, wherein the statistical extractor is configured to interpolate the histogram if the resolution of the DTC differs from the resolution of the TDC.

11. The apparatus of claim 9, wherein the TDC includes a stochastic-beating TDC.

12. The apparatus of claim 1, wherein the signal is a wireless communication signal.

13. A method of compensating nonlinearities of a digital-to-time converter (DTC), the method comprising:
   receiving phase data information at the DTC;
   generating a signal using the DTC and the phase data information;
   receiving the signal at a detector;
   determining an indication of nonlinearities of the DTC using the detector, the signal and the phase data information; and
   generating pre-distortion information for the DTC using the indication of nonlinearities and a pre-distortion module.

14. The method of claim 13, wherein the receiving the signal at a detector includes receiving the phase modulation information at a time-to-digital converter (TDC);
   wherein the method includes measuring phase differences between each phase modulation word of the phase data information and the signal; and
   wherein the determining the indication of nonlinearities includes determining the indication of nonlinearities using the phase differences.

15. The method of claim 14, wherein the receiving the signal at the detector includes receiving the phase modulation information at a stochastic-beating TDC.

16. The method of claim 13, wherein the receiving the signal at a detector includes receiving the phase modulation information at a statistical extractor;
   wherein the method includes:
   statistically measuring the signal using the statistical extractor; and
   comparing the statistical measurement of the signal to a known statistical measurement of the phase data information.

17. The method of claim 16, including adjusting parameters of a noise shaper of the DTC to compensate for nonlinearities of the DTC using the comparison of the statistical measurement of the signal to the known statistical measurement of the phase data information.

18. The method of claim 16, wherein the determining an indication of nonlinearities of the DTC includes generating a pre-distortion mapping table comprising information to compensate for nonlinearities of the DTC using the comparison of the statistical measurement of the signal to the known statistical measurement of the phase data information.

19. The method of claim 16, wherein the statistically measuring the signal includes generating a histogram of the signal using a time-to-digital converter (TDC).

20. The method of claim 19, including interpolating the histogram if the resolution of the DTC differs from the resolution of the TDC.

21. The method of claim 16, wherein the statistically measuring the signal includes generating a histogram of the signal using a stochastic-beating TDC.

22. The method of claim 13, including generating a wireless communication signal using the DTC and the phase data information.

* * * * *